(12) United States Patent
Paton et al.

(10) Patent No.: US 6,743,689 B1
(45) Date of Patent: Jun. 1, 2004

(54) METHOD OF FABRICATION SOI DEVICES WITH ACCURATELY DEFINED MONOCRYSTALLINE SOURCE/DRAIN EXTENSIONS

(75) Inventors: Eric N. Paton, Morgan Hill, CA (US); Robert B. Ogle, San Jose, CA (US); Cyrus E. Tabery, Cupertino, CA (US); Qi Xiang, San Jose, CA (US); Bin Yu, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/341,427

(22) Filed: Jan. 14, 2003

(51) Int. Cl.⁷ ............................................. H01L 21/336
(52) U.S. Cl. ...................... 438/305; 438/149; 438/162; 438/163; 438/166
(58) Field of Search ................... 438/149, 162, 163, 166, 197, 217, 311, 479, 514, 517, 519, 522, 302, 303, 305, 299, 291, 528; 257/347

(56) References Cited

U.S. PATENT DOCUMENTS

| | | | | |
|---|---|---|---|---|
| 5,595,919 A | * | 1/1997 | Pan | 438/302 |
| 5,736,446 A | * | 4/1998 | Wu | 438/305 |
| 5,899,719 A | * | 5/1999 | Hong | 438/289 |
| 5,998,807 A | * | 12/1999 | Lusting et al. | 257/66 |
| 6,114,211 A | * | 9/2000 | Fulford et al. | 438/305 |
| 6,184,097 B1 | * | 2/2001 | Yu | 438/299 |
| 6,225,176 B1 | * | 5/2001 | Yu | 438/305 |
| 6,248,637 B1 | * | 6/2001 | Yu | 438/300 |
| 6,271,095 B1 | * | 8/2001 | Yu | 438/302 |
| 6,297,115 B1 | * | 10/2001 | Yu | 438/305 |
| 6,297,117 B1 | * | 10/2001 | Yu | 438/305 |
| 6,391,728 B1 | * | 5/2002 | Yu | 438/291 |
| 6,472,282 B1 | * | 10/2002 | Yu | 438/305 |
| 6,495,887 B1 | * | 12/2002 | Krishnan et al. | 257/347 |
| 6,514,829 B1 | * | 2/2003 | Yu | 438/302 |
| 6,521,502 B1 | * | 2/2003 | Yu | 438/305 |
| 6,528,851 B1 | * | 3/2003 | Yu | 257/347 |
| 6,566,213 B2 | * | 5/2003 | En et al. | 438/305 |
| 6,624,037 B2 | * | 9/2003 | Buynoski et al. | 438/305 |
| 6,642,122 B1 | * | 11/2003 | Yu | 438/372 |

* cited by examiner

Primary Examiner—Maria Guerrero (57) ABSTRACT

Semiconductor devices comprising fully and partially depleted SOI transistors with accurately defined monocrystalline or substantially completely monocrystalline silicon source/drain extensions are fabricated by selectively pre-amorphizing intended source/drain extensions, ion implanting dopants into the pre-amorphized regions and laser thermal annealing to effect crystallization and activation of the source/drain extensions. Embodiments include forming a gate electrode over an SOI substrate with a gate dielectric layer therebetween, forming silicon nitride sidewall spacers on the side surfaces of the gate electrode, forming source/drain regions, forming a thermal oxide layer on the gate electrode and on the source/drain regions, removing the silicon nitride sidewall spacers, pre-amorphizing the intended source/drain extension regions, ion implanting impurities into the pre-amorphized regions and laser thermal annealing to crystallize the pre-amorphized regions and to activate the source/drain extensions.

15 Claims, 14 Drawing Sheets

METHOD OF FABRICATION SOI DEVICES WITH ACCURATELY DEFINED MONOCRYSTALLINE SOURCE/DRAIN EXTENSIONS

FIELD OF THE INVENTION

The present invention relates to a method of manufacturing highly reliable semiconductor devices based upon silicon-on-insulator (SOI) substrates. The present invention has particular applicability in manufacturing semiconductor devices with accurately formed ultra-shallow source/drain extensions which are essentially completely or substantially monocrystalline silicon and exhibit increased carrier mobility.

BACKGROUND ART

Conventional SOI types of substrates have evolved and basically comprise a substrate, such as a silicon-containing substrate, an insulating layer thereon, commonly referred to as a buried oxide layer, and a monocrystalline silicon layer on the insulating layer which constitutes the "body" of the transistor. In such SOI devices, the body floats in that there is no direct electrical connection thereto. As the source/drain regions are isolated from the substrate, junction capacitance is reduced, i.e., when an electrical signal changes on either or both source/drain regions, there is no capacitive coupling to the substrate. As electrical isolation is facilitated employing an SOI substrate, certain electrical elements of the circuit can be positioned closer together, thereby reducing the die size. SOI structures also offer the advantages of latch-up immunity, reduced junction leakage currents and reduced short channel effects, thereby translating to increased transistor speed.

SOI transistors can be partially depleted or fully depleted. A fully depleted SOI transistor is a transistor in which the film thickness of the monocrystalline silicon layer is thinner than the maximum depletion layer width. A partially-depleted SOI transistor is a transistor in which the film thickness of the monocrystalline silicon layer is greater than the maximum depletion layer width. Each type of SOI transistor offers advantages. For example, because it threshold voltage can be set to a high level, a partially-depleted SOI transistor can suppress the stand-by leakage current to a low level. A fully depleted SOI transistor can reduce sub-threshold swing and therefore enable high-speed operation at low voltage.

In fabricating SOI transistors with ultra shallow source/drain extensions, it is necessary to accurately define the extensions and to provide a desirable high impurity concentration therein. Accordingly, pre-amorphization techniques have been employed. However, it is desirable to recrystallize the source/drain extensions such that polycrystalline silicon is not formed, as the mobility of electrons and holes in polycrystalline silicon is lower than in monocrystalline silicon, due to scattering at the grain boundaries. However, the avoidance of polycrystalline silicon formation upon recrystallization is extremely difficult.

Accordingly, there exists a need for methodology enabling the fabrication of SOI transistors with accurately defined source/drain extensions which are essentially completely or substantially monocrystalline silicon with and attendant increase in carrier mobility.

DISCLOSURE OF THE INVENTION

An advantage of the present invention is a method of manufacturing a semiconductor device comprising an SOI transistor exhibiting high carrier mobility.

Another advantage of the present invention is a method of manufacturing a fully depleted or partially depleted SOI transistor with essentially completely or substantially monocrystalline silicon source/drain extensions exhibiting improved carrier mobility.

Additional advantages and other features of the present invention will be set forth in the description which follows and in part will be apparent to those having ordinary skill in the art upon examination of the following or maybe learned from the practice of the present invention. The advantages of the present invention may be realized and obtained as particularly pointed out in the appended claims.

According to the present invention, the foregoing and other advantages are achieved by a method of manufacturing a semiconductor device, the method comprising: forming a silicon-on-insulator (SOI) substrate comprising an insulating layer on a substrate and a layer of monocrystalline silicon (Si) on the insulating layer; forming a gate electrode, having an upper surface and side surfaces, over an upper surface of the SOI substrate with a gate dielectric layer therebetween; forming dielectric sidewall spacers on the side surfaces of the gate electrode; ion implanting and annealing to form source/drain regions in the monocrystalline Si layer extending down into the insulating layer; thermally oxidizing to form a protective oxide layer on the upper surface of the gate electrode and on the upper surface of the SOI substrate over the source/drain regions; removing the dielectric sidewall spacers, thereby exposing portions of the upper surface of the SOI substrate between the protective oxide layers thereon and the side surfaces of the gate electrodes; ion implanting to form a pre-amorphized region in the monocrystalline silicon Si layer adjacent to each source/drain region to define intended source/drain extensions; ion implanting impurities into the pre-amorphized regions; and laser thermal annealing to recrystallize the pre-amorphized regions and to activate the source/drain extensions, thereby forming a field effect transistor.

Embodiments include forming additional dielectric sidewall spacers on the side surfaces of the gate electrode after laser thermal annealing and then forming a metal silicide layer on the upper surface of the gate electrode and on the upper surface of the SOI substrate over the source/drain regions. Embodiments of the present invention further comprise forming the source/drain extensions extending down to the insulating layer, wherein the field effect transistor is fully depleted or forming the source/drain extensions such that they do not extend down to the insulating layer wherein the field effect transistor is partially depleted.

Additional advantages of the present invention will become readily apparent to those skilled in this art from the following detailed description wherein embodiments of the present invention are described simply by way of illustration by the best mode contemplated for carrying out the present invention. As will be realized, the present invention is capable of other and different embodiments, and it's several details are capable of modifications in various obvious respects, or without departing from the present invention. Accordingly, the drawings and description are to be regarded as illustrative in nature, and not as restrictive.

BRIEF DESCRIPTION OF THE DRAWINGS

In FIGS. 1 through 7 similar features or elements are denoted by similar reference characters. In FIGS. 8 through 14, similar features or elements are denoted by similar reference characters.

DESCRIPTION OF THE INVENTION

The present invention addresses and solves the problem of accurately forming source/drain extensions with reduced polycrystalline silicon formation and hence improved carrier mobility in SOI transistors, including partially depleted and fully depleted SOI transistors. The present invention addresses and solves that problem by implementing a strategic sequence of manipulative steps which include selectively pre-amorphizing intended source/drain extension regions, ion implanting dopants into the pre-amorphized regions and then laser thermal annealing to rapidly melt and rapidly quench to recrystallize the pre-amorphized source/drain extension regions. Significantly, during such laser thermal annealing, either exclusive lateral recrystallization occurs, as when forming fully depleted SOI transistors, or primarily lateral recrystallization occurs, as when forming partially depleted SOI transistors, thereby minimizing the formation of polycrystalline silicon while maximizing the formation of monocrystalline silicon, resulting in a significant improvement in the mobility of electrons and holes by reducing grain boundaries.

An embodiment of the present invention relating to the formation of fully depleted SOI transistors is schematically illustrated in FIGS. 1 through 7. Adverting to FIG. 1, an SOI structure is provided comprising a Si-containing substrate portion 10, an insulating layer 11, typically referred to as a buried oxide layer, on substrate portion 10, and a monocrystalline silicon (Si) layer 12 formed on the insulating layer 11. Monocrystalline layer 12 typically has a thickness of 100 Å to 500 Å. A gate electrode 13, such as doped polycrystalline silicon, is formed over the SOI substrate with a gate dielectric layer 14 therebetween, typically silicon oxide. Dielectric sidewall spacers 15 are then formed on side surfaces of the gate electrode, such as silicon nitride. Ion implantation is then conducted, as illustrated by arrows 16, followed by rapid thermal annealing to form source/drain regions 17 which extend into monocrystalline Si layer 12 down to insulating layer 11.

Figure 1:
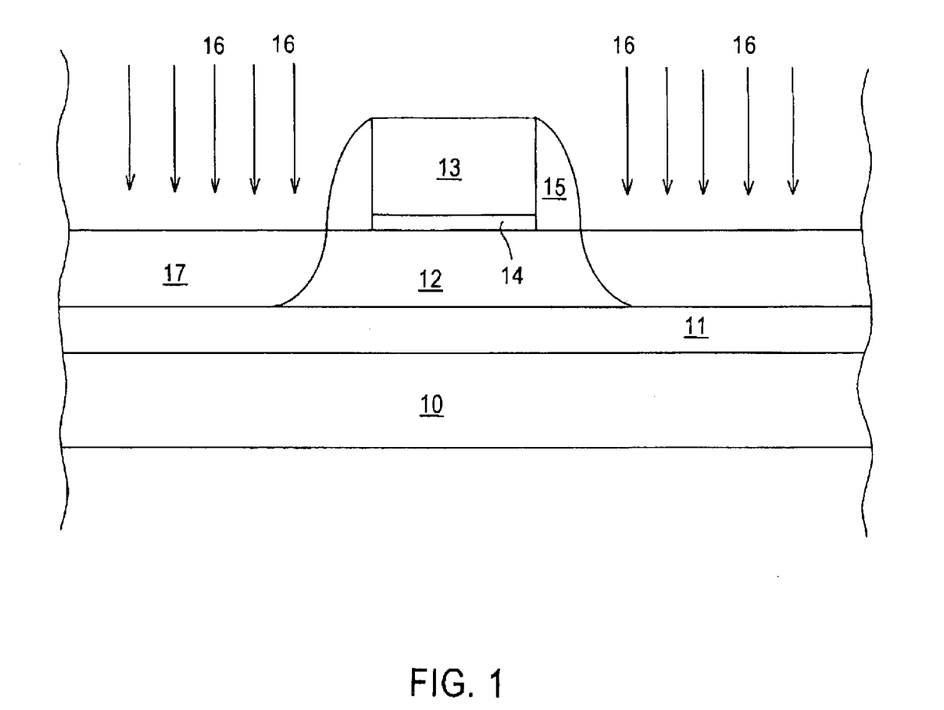
FIGS. 1 through 7 schematically illustrate sequential phases of a method in accordance with an embodiment of the present invention.
Figure 2:
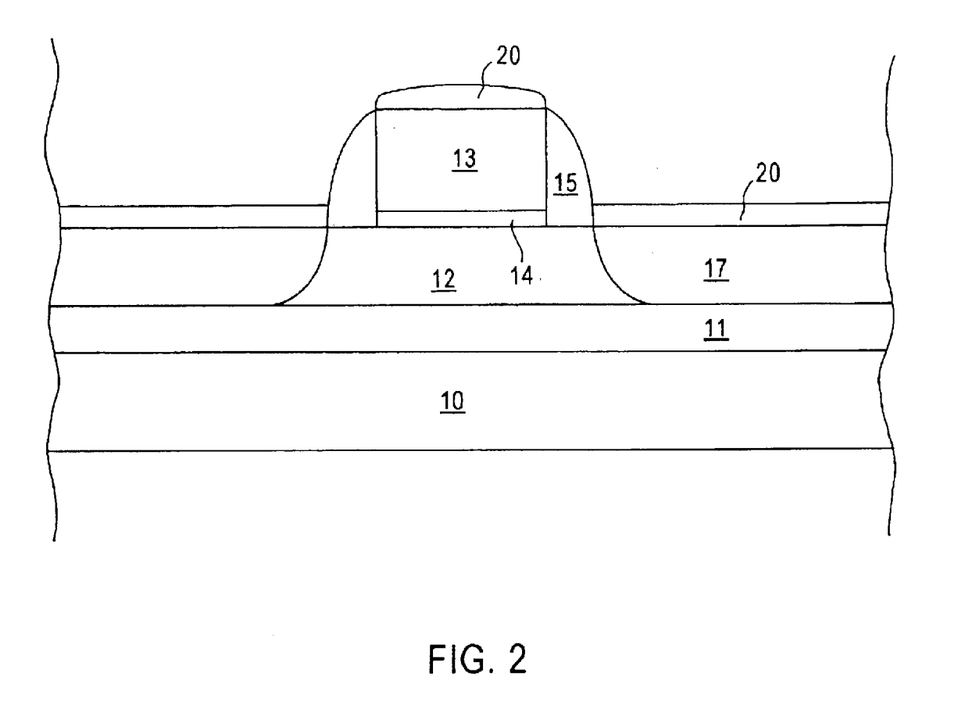

Subsequently, thermal oxidation is conducted to form a protective oxide layer 20 on the upper surface of gate electron 13 and on the upper surface of SOI substrate overlying the source/drain regions 17, as illustrated in FIG. 2. Protective oxide layers 20 typically have a thickness of 400 Å to 600 Å, e.g., 500 Å. Silicon nitride sidewall spacers 15 typically have a width at the upper surface of the SOI substrate of 50 Å to 200 Å overlying the intended source/drain extensions.

Figure 3:
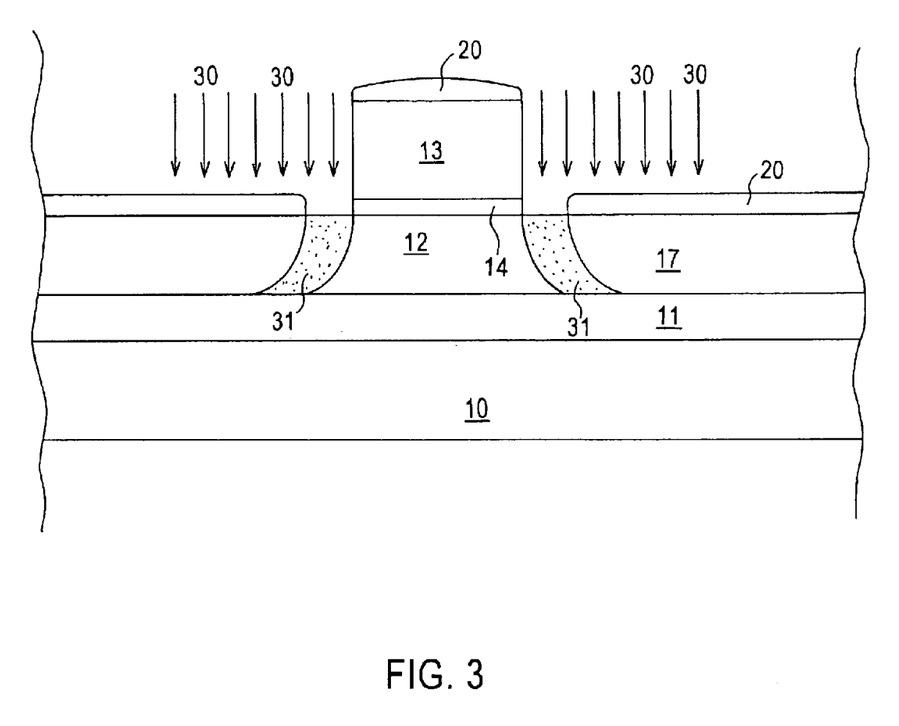

Subsequently, as illustrated in FIG. 3, silicon nitride sidewall spacers are selectively removed employing a conventional etchant, such as a solution of hot phosphoric acid. Ion implantation is then conducted, as illustrated by arrows 30, to form pre-amorphized regions 31 extending down to insulating layer 11. Protective oxide layers 20 have a thickness sufficient to prevent ions from penetrating thereunder and, hence, prevent pre-amorphization thereunder, thereby enabling selective pre-amorphization and accurate definition of intended source/drain extension regions 31. Ion implantation to form pre-amorphized regions 31 can be implemented by implanting elements such as Si, germanium (Ge) or xenon (Xe). For example, Xe can be implanted at an implantation dosage of $1 \times 10^{14}$ to $5 \times 10^{14}$ ions/cm$^2$ at an implantation energy of 10 to 40 KeV.

Figure 4:
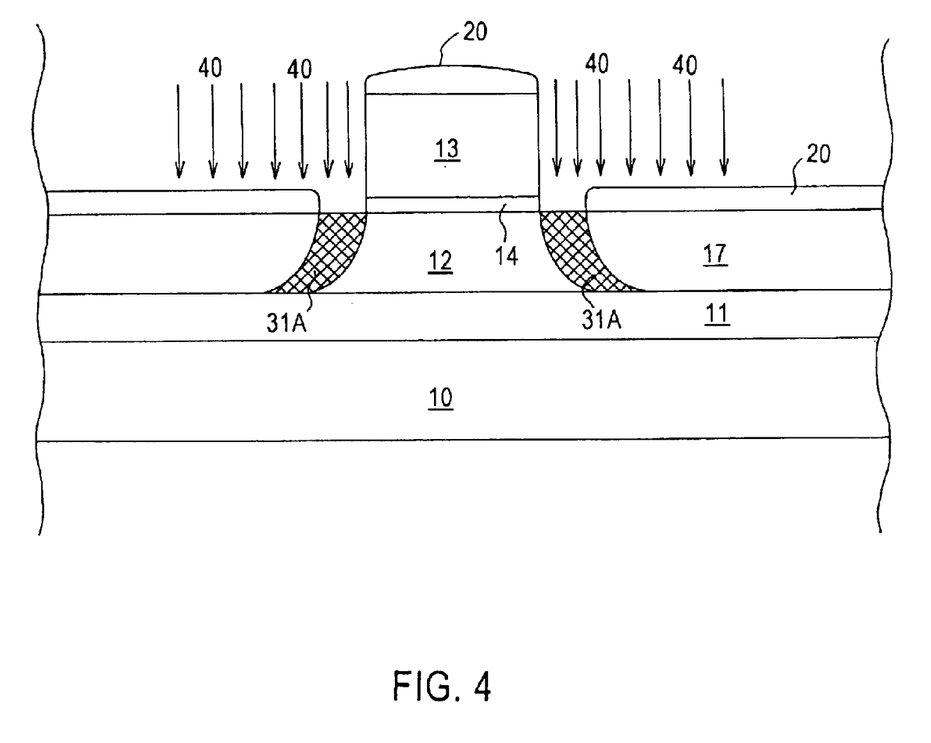

Adverting to FIG. 4, ion implantation is then conducted, as illustrated by arrows 40, to implant impurities into the pre-amorphized regions 31, thereby forming implanted pre-amorphized regions 31A. Ion implantation 40 can be implanted employing impurities similar to or different from those employed to form source/drain regions 16 but of the same conductivity type. Implanted pre-amorphized source/drain extension regions 31A are typically formed at a different dosage or using a dopant with a different diffusivity than that employed for forming source/drain regions 17, typically at a higher dosage than that employed in forming source/drain regions 17. For example, in forming P-channel transistors, BF$_2$ may be implanted at a dosage of $3 \times 10^{14}$ to $3 \times 10^{15}$ ions/cm$^2$ at an implantation energy of 1 to 3 KeV, or B$_{11}$ may be implanted at an implantation dosage of $3. \times 10^{14}$ to $3 \times 10^{15}$ ions/cm$^2$ at an implantation energy of 200 to 500 KeV. In forming N-channel transistors, arsenic (As) may be implanted at an implantation dosage of of $3 \times 10^{14}$ to $3 \times 10^{15}$ ions/cm$^2$ at an implantation energy of 1 to 3 KeV, or antimony (Sb) may be implanted at an implantation dosage of $3 \times 10^{14}$ to $3 \times 10^{15}$ ions/cm$^2$ at an implantation energy of 3 to 5 KeV. Advantageously, protective oxide layer 20 also prevents implantation of additional impurities thereunder and enables the selective implantation impurities into the pre-amorphized regions 30.

Figure 5:
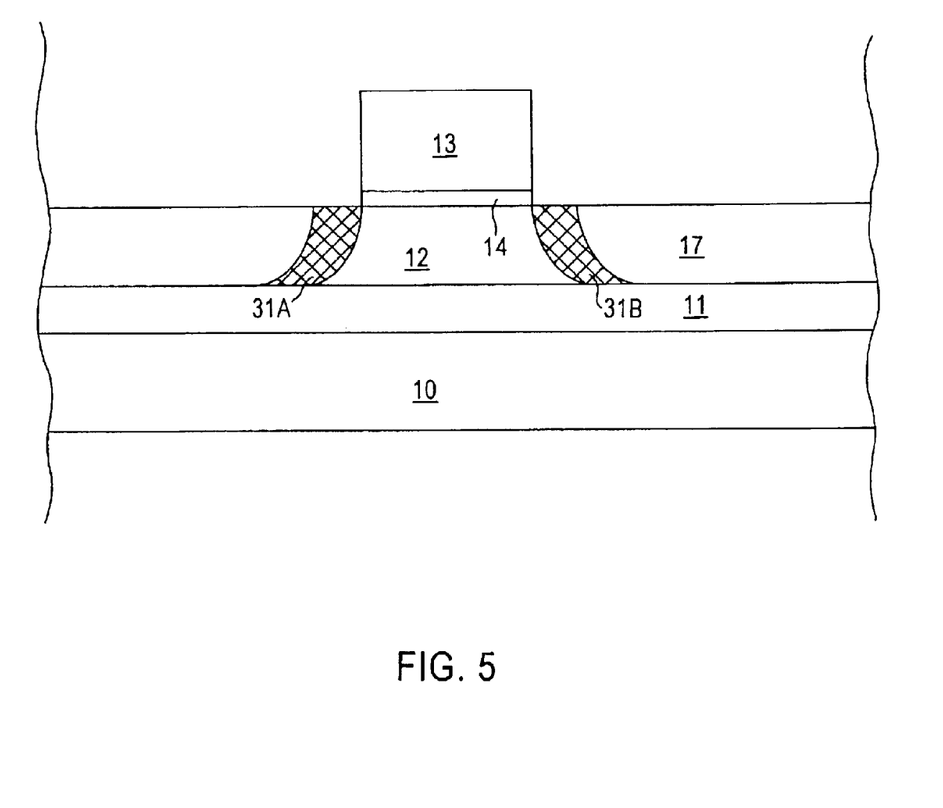
Figure 6:
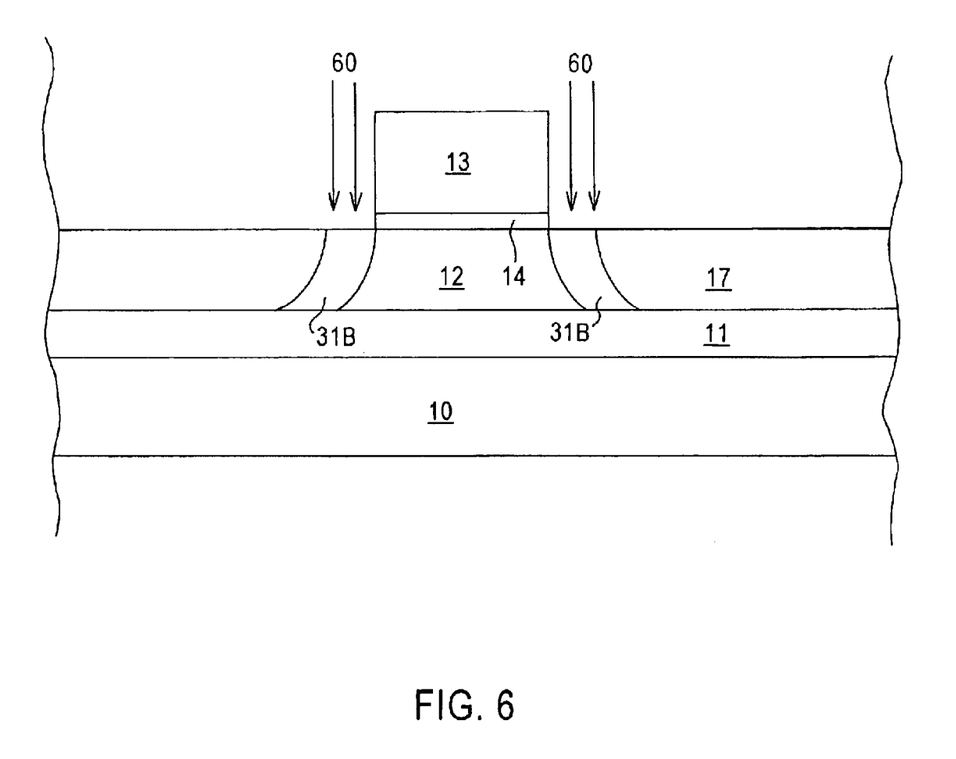

The protective oxide layer 20 is then removed, as illustrated in FIG. 5, typically by employing a solution of buffered hydrofluoric acid. Subsequently, as illustrated in FIG. 6, laser thermal annealing is conducted, as illustrated by arrows 60, to recrystallize implanted pre-amorphized regions 31A and to activate source/drain extensions 31B. Advantageously, since the implanted pre-amorphized regions 31A extend completely down to insulating layer 11, crystallization is exclusively in the lateral direction thereby forming essentially completely monocrystalline silicon source/drain extensions 31B. The expression "essentially completely monocrystalline silicon" is employed in recognition of the possibility that some grain boundaries may exist; however, for all practical purposes it may be considered essentially pure monocrystalline Si, i.e., greater than 98% monocrystalline Si.

Figure 7:
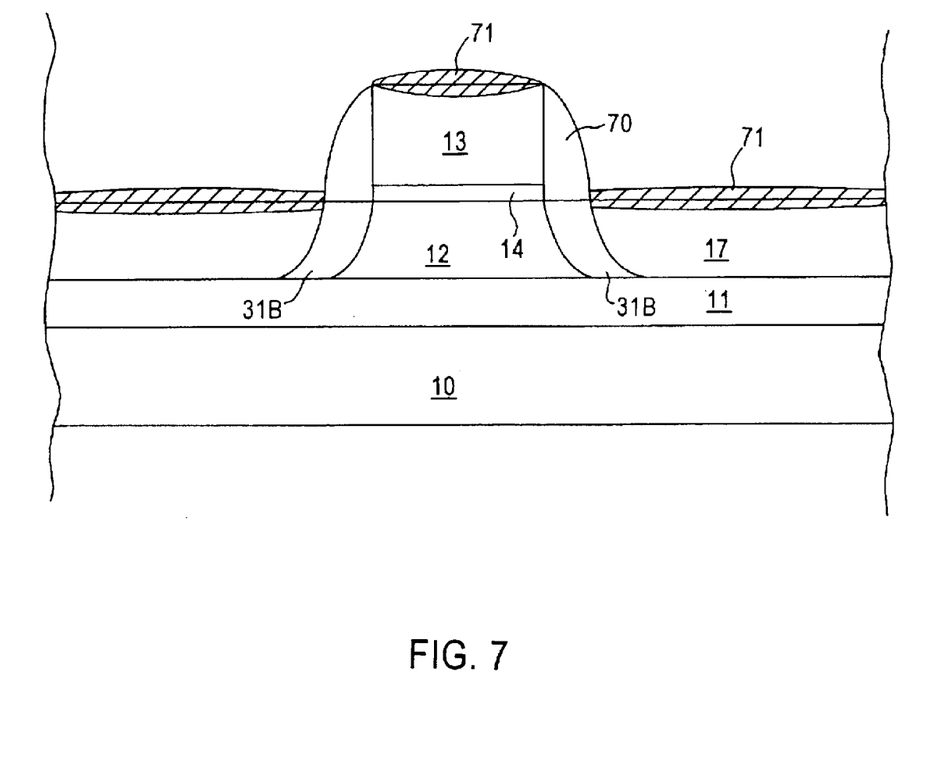
Figure 8:
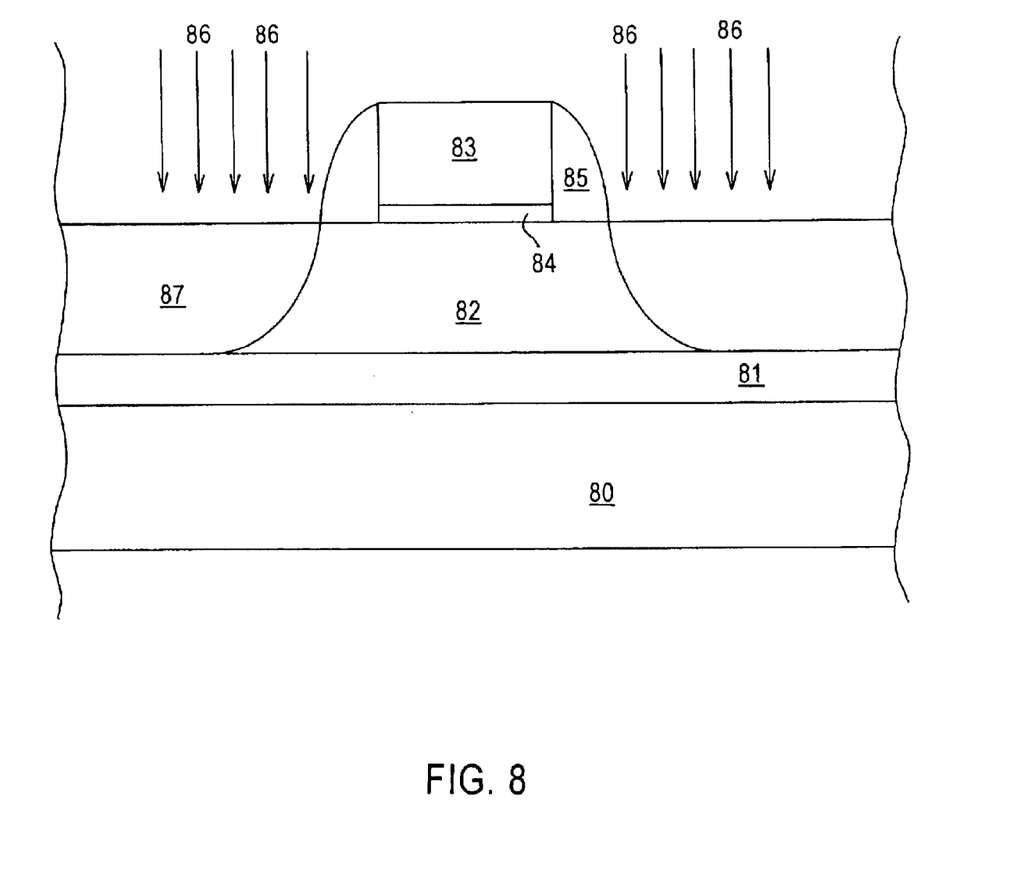
FIGS. 8 through 14 schematically illustrate sequential phases of a method in accordance with another embodiment of the present invention.

Subsequently, as illustrated in FIG. 7, sidewall spacers 70 are then formed on the side surfaces of the gate electrode 13, typically of silicon nitride. Silicidation is then implemented in a conventional manner, as by depositing a layer of cobalt, nickel or tungsten, and then heating to form metal silicide layers 70 on the upper surface of gate electrode 13 and on the upper surface of the SOI substrate overlying source/drain regions 17. The resulting structure illustrated in FIG. 7 comprises a fully depleted SOI transistor wherein source/drain extensions 31B are essentially completely monocrystalline, thereby exhibiting high carrier mobility by virtue significantly reduced grain boundaries.

An embodiment of the present invention comprising methodology for forming a partially depleted SOI transistor is schematically illustrated through FIGS. 8 through 14. Adverting to FIG. 8, an SOI substrate is formed comprising an Si-containing substrate portion 80, and insulating layer 81 thereon and a monocrystalline Si layer 82 on insulating layer 81. Monocrystalline silicon layer 82 is typically formed at a greater thickness than when forming the fully depleted SOI transistor. For example, the thickness of monocrystalline Si layer 82 is typically about 400 Å to about 1000 Å. Gate electrode 83 is formed over the SOI substrate with a gate dielectric layer 84 therebetween. Removable silicon nitride sidewall spacers 85, typically having a width at the SOI substrate surface of 50 Å to 200 Å, are formed on the side surfaces of gate electrode 83. Ion implantation is then conducted, as illustrated by arrows 86, followed by rapid thermal annealing to form source/drain regions 87.

Figure 9:
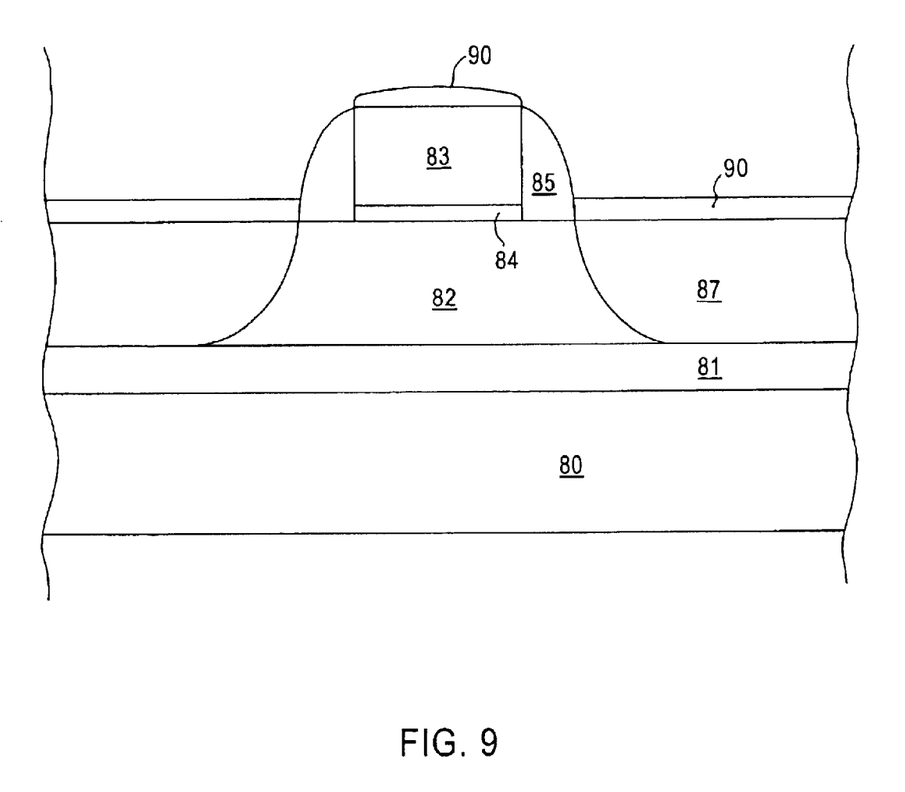

Subsequently, as illustrated in FIG. 9, thermal oxidation is conducted to form protective oxide layers 90 on the upper surface of gate electrode 83 and on the upper surface of SOI substrate overlying source/drain regions 87. Protective oxide layer 90 has a thickness sufficient to prevent penetration therethrough by subsequented pre-amorphization and dopant implantations, such as a thickness of 400 Å to 600 Å, e.g., 500 Å.

Figure 10:
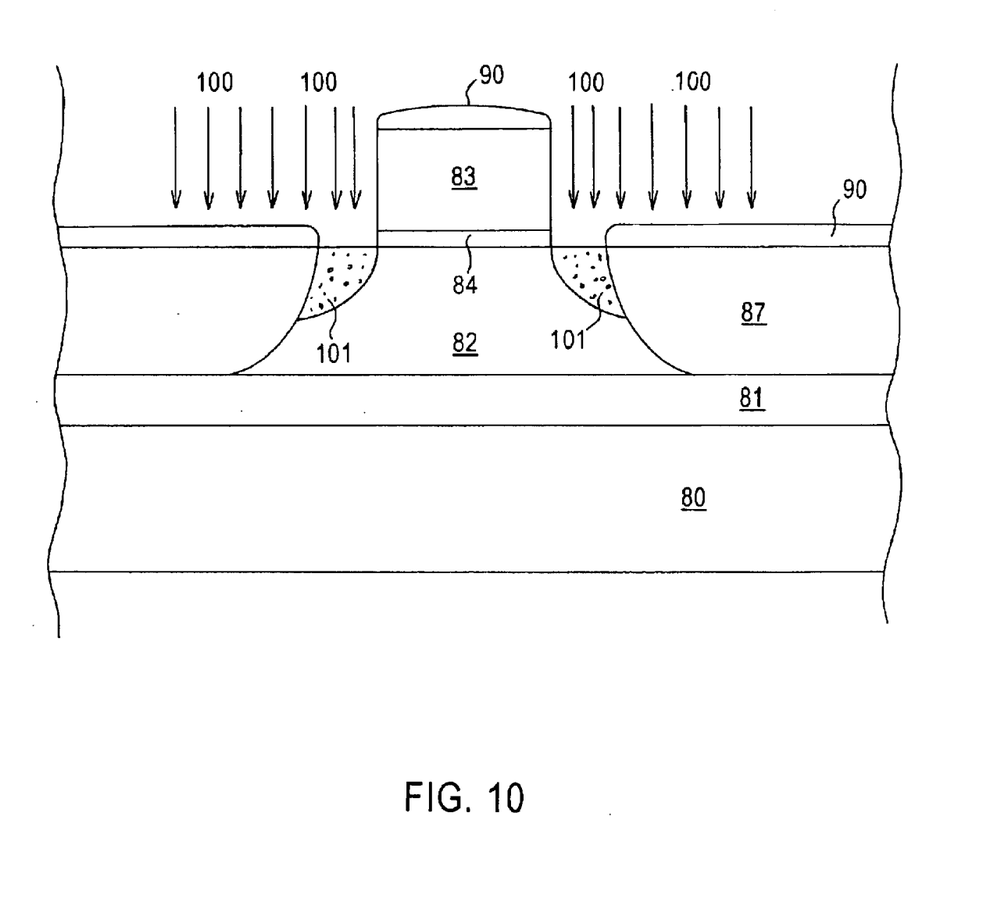

Silicon nitride sidewall spacers 83 are then removed as shown in FIG. 10, as with a solution of hot phosphoric acid. Ion implantation is then conducted, as illustrated by arrows 100, using protective oxides 90 as masks, to selectively form pre-amorphized regions 101 extending in monocrystalline Si layer 82, but not reaching insulating layer 81. Typically, the pre-amorphized regions 101 are formed at a depth of 100 Å to 500 Å. Pre-amorphized regions 101 can be formed in a manner similar to forming pre-amorphized regions 31 illustrated in FIG. 3, e.g., by implanting Xe at an implantation dosage of $1 \times 10^{14}$ to $5 \times 10^{14}$ ions/cm$^2$ at an implantation energy of 10 to 40 KeV.

Figure 11:
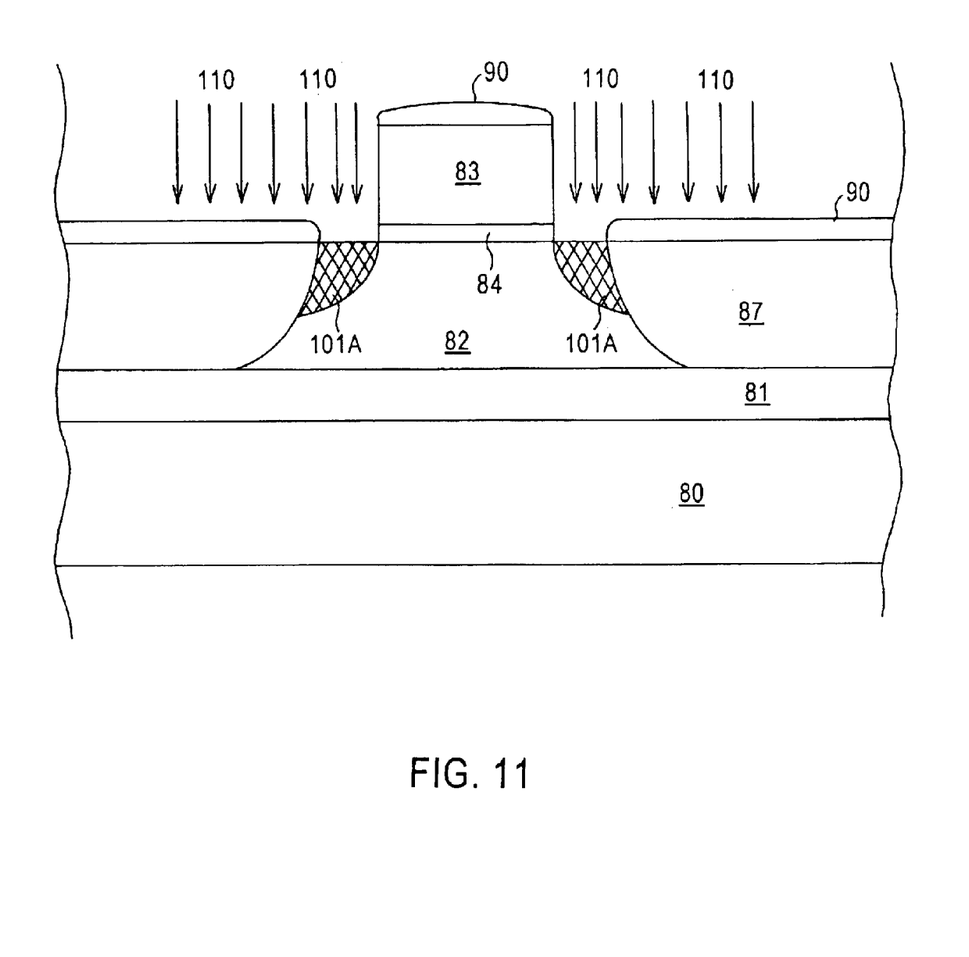

Subsequently, ion implantation is conducted, as illustrated by arrows 110 utilizing protective oxides 90 as masks, to selectively implant impurities into pre-amorphized regions 101 forming implanted pre-amorphized extension regions 101A. Ion implantation 110 can be conducted under conditions similar to those employed in forming implanted amorphized regions 31A, illustrated in FIG. 4.

Figure 12:
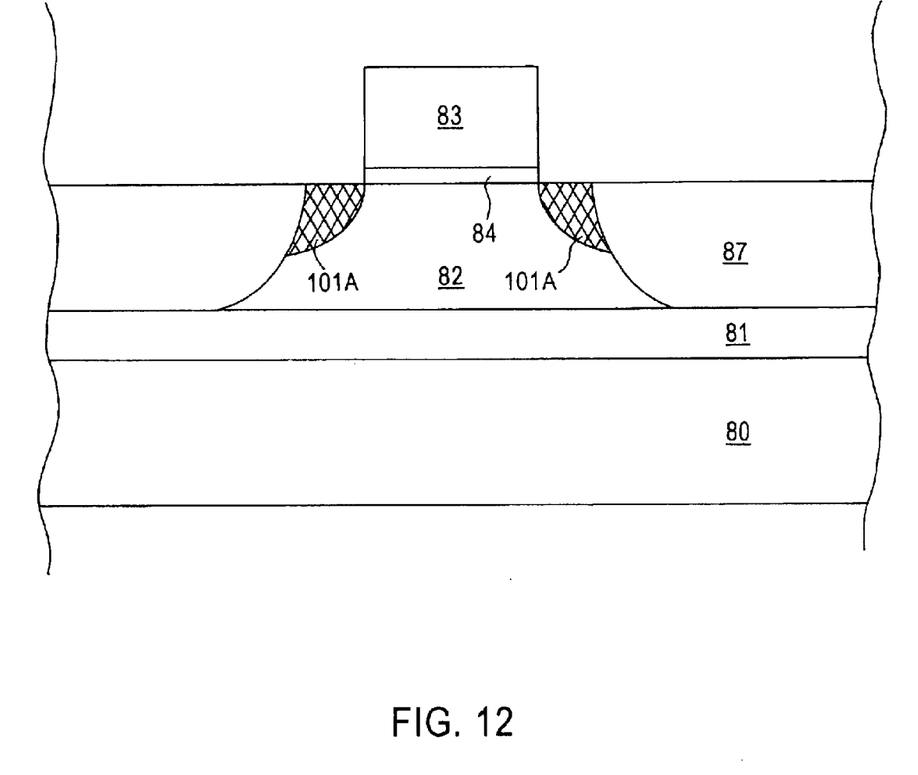
Figure 13:
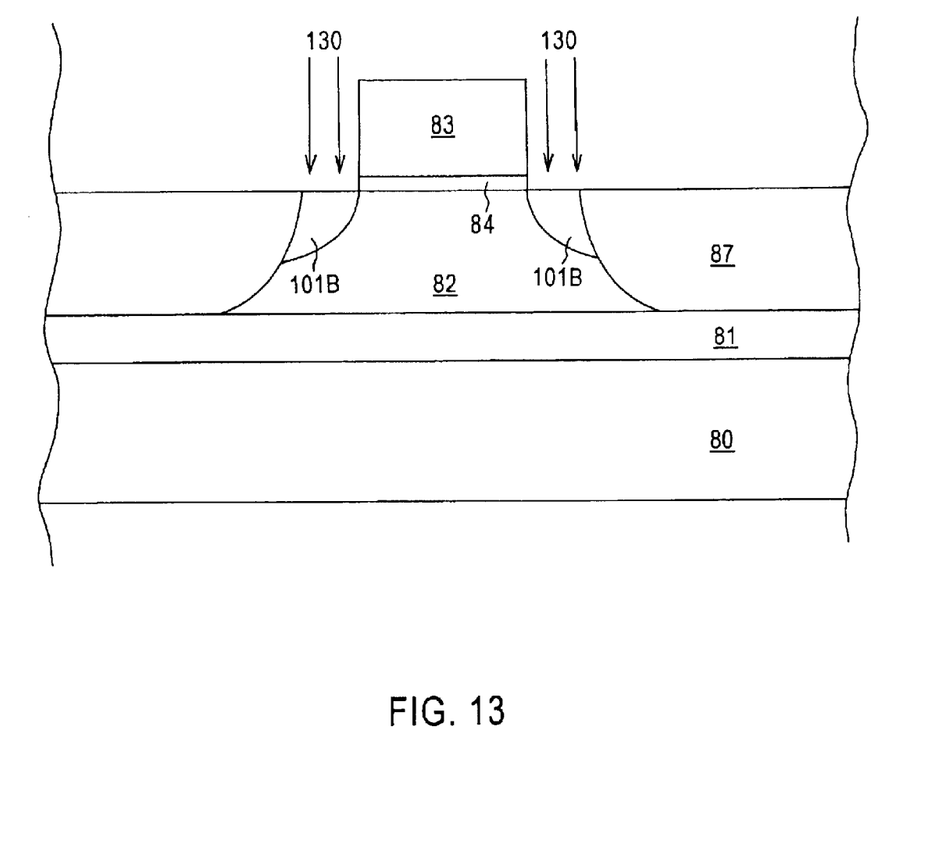

As illustrated in FIG. 12, protective oxide layers 90 are then removed, as by employing a buffered solution of hydrofluoric acid. Subsequently, laser thermal annealing is implemented, as illustrated by arrows 130 in FIG. 13, to recrystallize implanted pre-amorphized regions 101A and to activate source/drain extensions 101B. Such laser thermal annealing can be implemented under conditions similar to those employed in recrystallizing implanted amorphized regions 31A to form source/drain extensions 31B illustrated in FIG. 6, e.g., by impinging a laser light beam at a radiant fluence of 0.2 to 0.8 joules/cm$^2$ for 1 to 10 nanoseconds thereby elevating the temperature of the targeted implanted pre-amorphized regions 101A to 1,200° C. to 1,300° C. As apparent from FIG. 13, recrystallization occurs significantly faster laterally than vertically as solidification proceeds both from source/drain regions 87 and from monocrystalline silicon layer 82. Accordingly, the resulting source/drain extension 101B is substantially monocrystalline. The expression "substantially monocrystalline silicon" is employed to denote that source/drain extensions 101B are predominantly monocrystalline silicon although some polycrystalline silicon exist, e.g., at least 98% of monocrystalline. Since source/drain extensions 101B are predominantly monocrystalline although some polycrystalline may form by virtue of the small vertical component of recrystallization, they also exhibit high carrier mobility, although not to the extent exhibited by those in the fully depleted SOI transistors.

Figure 14:
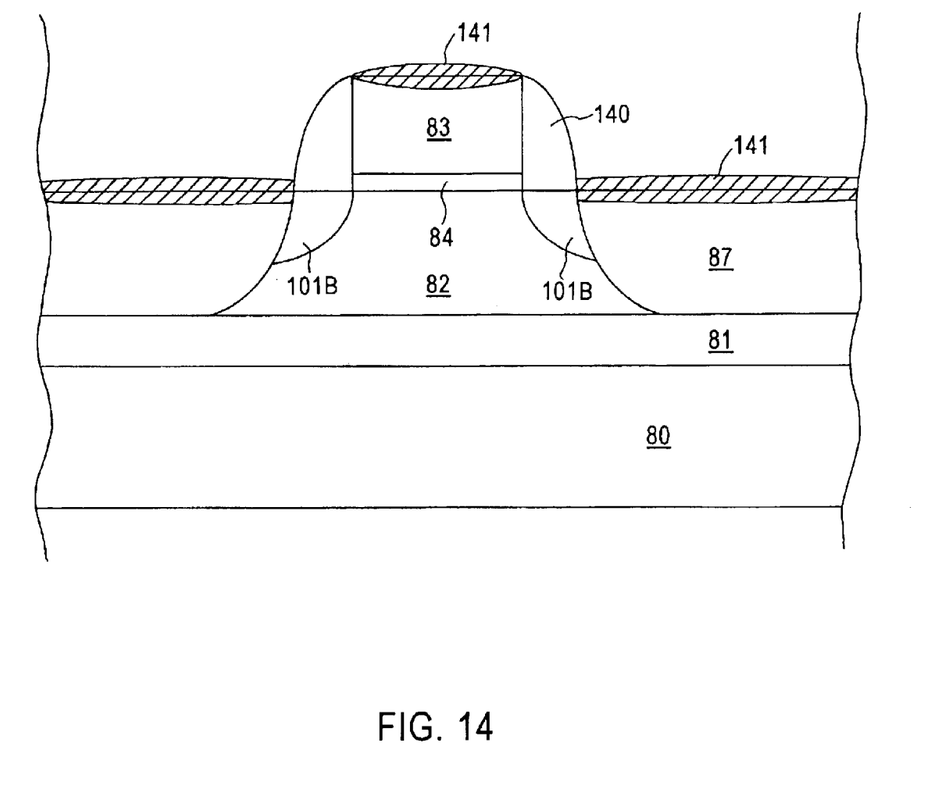

Subsequently, dielectric sidewall spacers 140, such as silicon nitride, are formed on the side surfaces of gate electrode 83, followed by silicidation to form metal silicide layers 141 on the upper surface of gate electrode 83 and on the upper surface of the SOI substrate overlying source/drain regions 87, in a manner similar to that employed in forming metal silicide layers 71 illustrated in FIG. 7.

The selective formation of pre-amorphized regions in accordance with embodiments of the present invention enables the accurate definition of source/drain extensions in SOI devices. By forming pre-amorphized regions, the melting point of silicon is reduced by about 300° C. The use of laser thermal annealing in the context of the present invention advantageously enables pin-point accuracy in targeting the implanted pre-amorphized regions for recrystallization and activation. Further, laser thermal annealing with rapid heating and quenching preserves the high dopant concentration of the dopant supersaturated pre-amorphized regions. Laser thermal annealing with pin-point accuracy avoids unnecessarily elevating the temperature of other portions of the wafer which would otherwise cause various problems, such as undue dopant diffusion and defect generation.

In implementing embodiments of the present invention, any of various commercially available laser tools may be employed, such as those utilizing a laser source capable of operating energies of about 10 to about 2000 mJ/cm$^2$/pulse, e.g., about 100 to 400 mJ/cm$^2$/pulse. Commercially available tools exist which can perform such laser thermal annealing, either with or without a mask. Verdent Technologies laser anneal tools are but an example and operate at an exposure wavelength of 308 nm, 5832 nm and 1064 nm.

The present invention provides enabling methodology for fabricating SOI semiconductor devices with improved carrier mobility by enabling the accurate formation of high dopant concentration source/drain extensions which are essentially completely or substantially monocrystalline exhibiting very few grain boundaries. The present invention enjoys industrial applicability in manufacturing various types of semiconductor devices, particularly highly integrated semiconductor devices exhibiting increased circuit speed and sub-micron dimensions, e.g., with a design rule below 0.12 micron with high reliability.

In the preceding detailed description, the present invention is described with reference to specifically exemplary embodiments thereof. It will, however, be evident that various modifications and changes may be made thereto without departing from the broader spirit and scope of the present invention, as set forth in the claims. The specification and drawings are, accordingly, to be regarded as illustrative and not restrictive. It is understood that the present invention is capable of using various other combinations and environments and is capable of changes or modifications within the scope of the inventive concept as expressed herein.

What is claimed is:

1. A method of manufacturing a semiconductor device, the method comprising:
   forming a silicon-on-insulator (SOI) substrate comprising an insulating layer on a substrate and a layer of monocrystalline silicon (Si) on the insulating layer;
   forming a gate electrode, having an upper surface and side surfaces, over an upper surface of the SOI substrate with a gate dielectric layer therebetween;
   forming first dielectric sidewall spacers on the side surfaces of the gate electrode;
   ion implanting and annealing to form source/drain regions in the Si layer extending down to the insulating layer;
   thermally oxidizing to form a protective oxide layer on the upper surface of the gate electrode and on the upper surface of the SOI substrate on the source/drain regions;
   removing the first dielectric sidewall spacers, thereby exposing portions of the upper surface of the SOI substrate between the protective oxide layers thereon and the side surfaces of the gate electrode;

ion implanting to form pre-amorphized regions in the Si layer adjacent to each source/drain region to define intended source/drain extensions;

ion implanting impurities into the pre-amorphized regions; and laser thermal annealing to recrystallize the pre-amorphized regions and to activate the source/drain extensions, thereby forming a field effect transistor.

2. The method according to claim 1, comprising forming the first dielectric sidewall spacers at a width of 100 Å to 500 Å.

3. The method according to claim 1, comprising thermally oxidizing to form the protective oxide layers at a thickness of 400 Å to 600 Å.

4. The method according to claim 1, comprising ion implanting xenon (Xe) at an implantation dosage of $1 \times 10^{14}$ to $5 \times 10^{14}$ ions/cm2 and an implantation energy of 10 to 40 KeV to form the pre-amorphized regions.

5. The method according to claim 1, comprising:

ion implanting BF2 at an implantation dosage of $3 \times 10^{14}$ to $3 \times 10^{15}$ ions/cm2 and at an implantation energy of 1 to 3 KeV into the pre-amorphized regions; or ion implanting B11 at an implantation dosage of $3 \times 10^{14}$ to $3 \times 10^{15}$ ions/cm2 and at an implantation energy of 200 to 500 KeV into the pre-amorphized regions.

6. The method according to claim 1, comprising:

ion implanting As at an implantation dosage of $3 \times 10^{14}$ to $3 \times 10^{15}$ ions/cm2 and an implantation energy of 1 to KeV into the pre-amorphized regions; or ion implanting Sb at an implantation dosage of $3 \times 10^{14}$ to $3 \times 10^{15}$ ions/cm2 and an implantation energy of 3 to 5 KeV.

7. The method according to claim 1, comprising:

forming second dielectric sidewall spacers on the side surfaces of the gate electrode after laser thermal annealing; and forming a metal silicide layer on the upper surface of the gate electrode and on the upper surface of the SOI substrate over the source/drain regions.

8. The method according to claim 1, comprising laser thermal annealing by impinging a laser light beam at a radiant fluence of 0.2 to 0.8 joules/cm2 for 1 to 10 nanoseconds.

9. The method according to claim 1, comprising forming the source/drain extensions extending down to the insulating layer, wherein:

the field effect transistor is fully depleted; and the source/drain extensions are essentially completely monocrystalline.

10. The method according to claim 1, comprising forming the source drain extensions so that they do not extend down to the insulating layer, wherein the field effect transistor is partially depleted; and the source/drain extensions are substantially monocrystalline.

11. The method according to claim 7, comprising forming the second dielectric sidewall spacers from silicon nitride.

12. The method according to claim 8, comprising laser thermal annealing to elevate the pre-amorphized regions to a temperature of 1,200° C. to 1,300° C.

13. The method according to claim 9, wherein the layer of monocrystalline Si has a thickness of 100 Å to 500 Å.

14. The method according to claim 10, wherein the layer of monocrystalline Si has a thickness of 400 Å to 1000 Å.

15. The method according to claim 14, wherein the source/drain extensions extend to a depth of 100 Å to 500 Å in the layer of monocrystalline Si.

* * * * *